US008647138B1

(12) United States Patent
Chen

(10) Patent No.: US 8,647,138 B1
(45) Date of Patent: Feb. 11, 2014

(54) ELECTRICAL CONNECTOR

(71) Applicant: Lotes Co., Ltd., Keelung (TW)

(72) Inventor: Jian Fei Chen, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 13/707,321

(22) Filed: Dec. 6, 2012

(30) Foreign Application Priority Data

Oct. 9, 2012 (CN) ...................... 2012 2 0514319 U

(51) Int. Cl.
*H01R 13/62* (2006.01)

(52) U.S. Cl.
USPC ........................................... 439/331

(58) Field of Classification Search
USPC ........................................... 439/372, 331, 73
See application file for complete search history.

(56) References Cited

U.S. PATENT DOCUMENTS

| 7,101,210 B2 * | 9/2006 | Lin et al. ........................ 439/331 |
| 7,497,716 B2 * | 3/2009 | Hsu et al. ....................... 439/331 |
| 8,233,284 B2 * | 7/2012 | Ju et al. ......................... 361/753 |

* cited by examiner

*Primary Examiner* — Neil Abrams
*Assistant Examiner* — Travis Chambers
(74) *Attorney, Agent, or Firm* — Morris Manning & Martin LLP; Tim Tingkang Xia, Esq.

(57) ABSTRACT

An electrical connector includes an electrical connecting base for bearing a chip module, a press cover and an operating member. The press cover is covering on the electrical connecting base, and has a first fixing portion and a second fixing portion. A center line of the press cover passes through the second fixing portion. The press cover is provided with a first pressing portion and a second pressing portion for pressing the chip module. The first pressing portion and the second pressing portion are respectively located on two sides of the center line, and the second pressing portion is closer to the second fixing portion than the first pressing portion is. The operating member has a locking portion for pressing the second fixing portion, and an operating portion extending from the locking portion. The first pressing portion is closer to the operating portion than the second pressing portion is.

12 Claims, 6 Drawing Sheets

ELECTRICAL CONNECTOR

CROSS-REFERENCE TO RELATED APPLICATION

This non-provisional application claims priority under 35 U.S.C. §119(a) to Patent Application No. 201220514319.2, filed in P.R. China on Oct. 9, 2012, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates generally to an electrical connector, and more particularly to an electrical connector for electrically connecting a chip module to a circuit board.

BACKGROUND OF THE INVENTION

FIGS. 1 and 2 show a conventional electrical connector, which is used for electrically connecting a chip module e to a circuit board (not shown). The electrical connector includes an electrical connecting base a for receiving a plurality of conductive terminals (not shown), a seat b disposed around the electrical connecting base a, a press cover c covering on the electrical connecting base a, and a rocker d. The seat b has a hollow frame structure, on two opposite sides of which a first mounting portion b1 and a second mounting portion b2 are provided, and on another side of which a fastening portion b3 is provided. The press cover c also has a hollow frame structure, on two opposite sides of which a tongue portion c1 and a pivoting portion c2 are provided, and on the other two opposite sides of which a downward protrusion portion c3 for pressing the chip module e downward is provided. The pivoting portion c2 is pivotally connected to the first mounting portion b1. The rocker d has a first rod d1 and a second rod d2 bent and extending from the first rod d1. The first rod d1 has two connecting portions d11 and a locking portion d12 located between the two connecting portions d11, where the two connecting portions d11 are pivotally connected to the second mounting portion b2, and the locking portion d12 presses the tongue portion c1. The second rod d2 is fastened to the fastening portion b3, and used for fixing the rocker d.

When assembling the chip module e to the electrical connector, first, the chip module e is mounted on the electrical connecting base a. Next, the press cover c is rotated, so that the press cover c is covering on the chip module e. Then, the second rod d2 is operated, so that the locking portion d12 presses the tongue portion c1 and the second rod d2 is engaged with the fastening portion b3 of the seat b. In this way, the two protrusion portions c3 press the chip module e downward, so that the chip module e closely contacts the conductive terminals in the electrical connecting base a.

A common method in the industry is symmetrically disposing the two protrusion portions c3 so as to achieve a force balance on the chip module e. However, since the second rod d2 is disposed on only one end of the first rod d1 of the rocker d, the second rod d2 only acts on one end of the first rod d1 during operation. In this case, when the locking portion d12 presses the tongue portion c1, the force-receiving point of the tongue portion c1 is not the midpoint of the tongue portion c1, but is closer to the second rod d2, so that the downward force applied on the chip module e by the protrusion portion c3 close to the second rod d2 (for example, the protrusion portion c3 in the right part of the press cover c in FIG. 2) is large, and the downward force applied on the chip module e by the protrusion portion c3 away from the second rod d2 (for example, the protrusion portion c3 in the left part of the press cover c in FIG. 2) is small. This easily causes a force unbalance on the chip module e, and possibly results in permanent bending deformation of the conductive terminals on the side receiving a large force, or poor contact between the conductive terminals and the chip module e on the side receiving a small force, thereby affecting the electrical connection between the chip module e and the electrical connector.

Therefore, a heretofore unaddressed need exists in the art to address the aforementioned deficiencies and inadequacies.

SUMMARY OF THE INVENTION

In one aspect, the present invention is directed to an electrical connector for ensuring a force balance on a chip module.

In one embodiment, an electrical connector is used for electrically connecting a chip module, and includes an electrical connecting base for bearing the chip module, a press cover and an operating member. The press cover is covering on the electrical connecting base, and has a first fixing portion correspondingly fixed to a fixing member, and a second fixing portion opposite to the first fixing portion. A center line of the press cover passes through the second fixing portion. The press cover is provided with a first pressing portion and a second pressing portion for pressing the chip module. The first pressing portion and the second pressing portion are respectively located on two sides of the center line, and the second pressing portion is closer to the second fixing portion than the first pressing portion is. The operating member has a locking portion for pressing the second fixing portion, and an operating portion extending from the locking portion. The first pressing portion is closer to the operating portion than the second pressing portion is.

In one embodiment, the first pressing portion and the second pressing portion are parallel to the center line, and a distance between the first pressing portion and the center line is equal to that between the second pressing portion and the center line.

Further, a through hole is formed on an upper surface of the press cover to partially receive the chip module, and the first pressing portion and the second pressing portion are respectively provided on two opposite inner edges of the through hole.

Further, the center of the chip module is closer to the second fixing portion than the center of the first pressing portion is.

Further, the fixing member is disposed around the electrical connecting base, and the first fixing portion is pivotally connected to the fixing member. The locking portion is pivotally connected to the fixing member, and the operating portion is fastened to the fixing member to fix the operating member.

As compared with the related art, in the electrical connector of the present invention, among other things, since the second pressing portion is closer to the second fixing portion than the first pressing portion is, the difference between the forces received by the first pressing portion and the second pressing portion caused by that the first pressing portion is close to the operating portion and the second pressing portion is far away from the operating portion is eliminated, so that a force balance is achieved when the chip module is pressed by the first pressing portion and the second pressing portion, thereby ensuring a stable electrical connection between the chip module and the electrical connector.

In another embodiment, an electrical connector is used for electrically connecting a chip module, and includes an electrical connecting base for bearing the chip module and a press cover. The press cover is located above the electrical connecting base, and has a front end and a rear end opposite to the front end. A center line is defined on the press cover along a front-to-rear direction. The press cover is provided with a first pressing portion and a second pressing portion which are respectively located on two sides of the center line. When the chip module is assembled to the electrical connecting base and the front end and the rear end are fixed, the first pressing portion and the second pressing portion press the chip module downward, and the first pressing portion and the second pressing portion are staggered in the front-to-rear direction, so as to achieve a force balance on the chip module.

Further, the electrical connector further includes a rocker. The rocker has a locking portion and an operating portion extending from the locking portion, and the locking portion is operated by the operating portion to press the front end. The first pressing portion is closer to the operating portion than the second pressing portion is, and the first pressing portion is at least partially located behind the second pressing portion. The electrical connector further includes a fixing member disposed around the electrical connecting base, and the rear end is pivotally connected to the fixing member. The locking portion is pivotally connected to the fixing member, and the operating portion is fastened to the fixing member to fix the operating member.

Further, the first pressing portion and the second pressing portion are parallel to the center line, and a distance between the first pressing portion and the center line is equal to that between the second pressing portion and the center line.

As compared with the related art, in the electrical connector of the present invention, among other things, since the first pressing portion and the second pressing portion are staggered in the front-to-rear direction, the difference between the forces received by the first pressing portion and the second pressing portion caused by the difference between the distances from the first pressing portion and the second pressing portion to the operating portion is eliminated, so that a force balance is achieved when the chip module is pressed by the first pressing portion and the second pressing portion, thereby ensuring a stable electrical connection between the chip module and the electrical connector.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
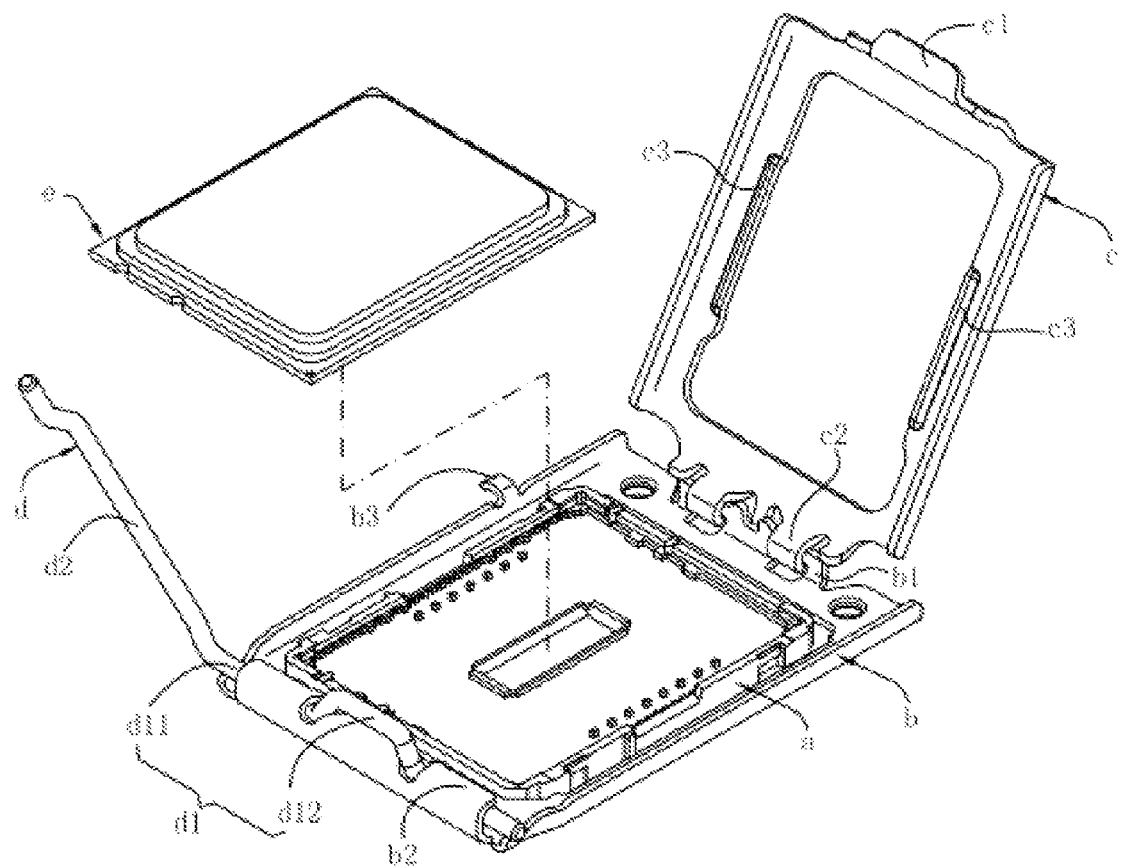
FIG. 1 is a three-dimensional view of an electrical connector and a chip module before assembly in prior art.
Figure 2:
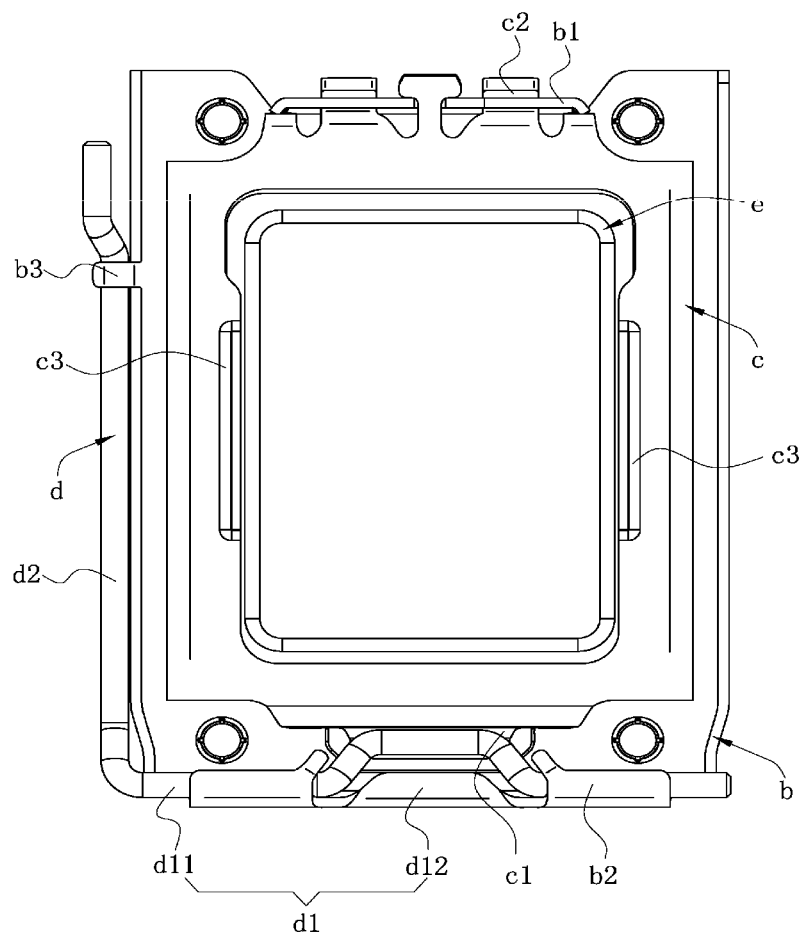
FIG. 2 is a three-dimensional view of an electrical connector and a chip module after assembly in prior art.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

Figure 3:
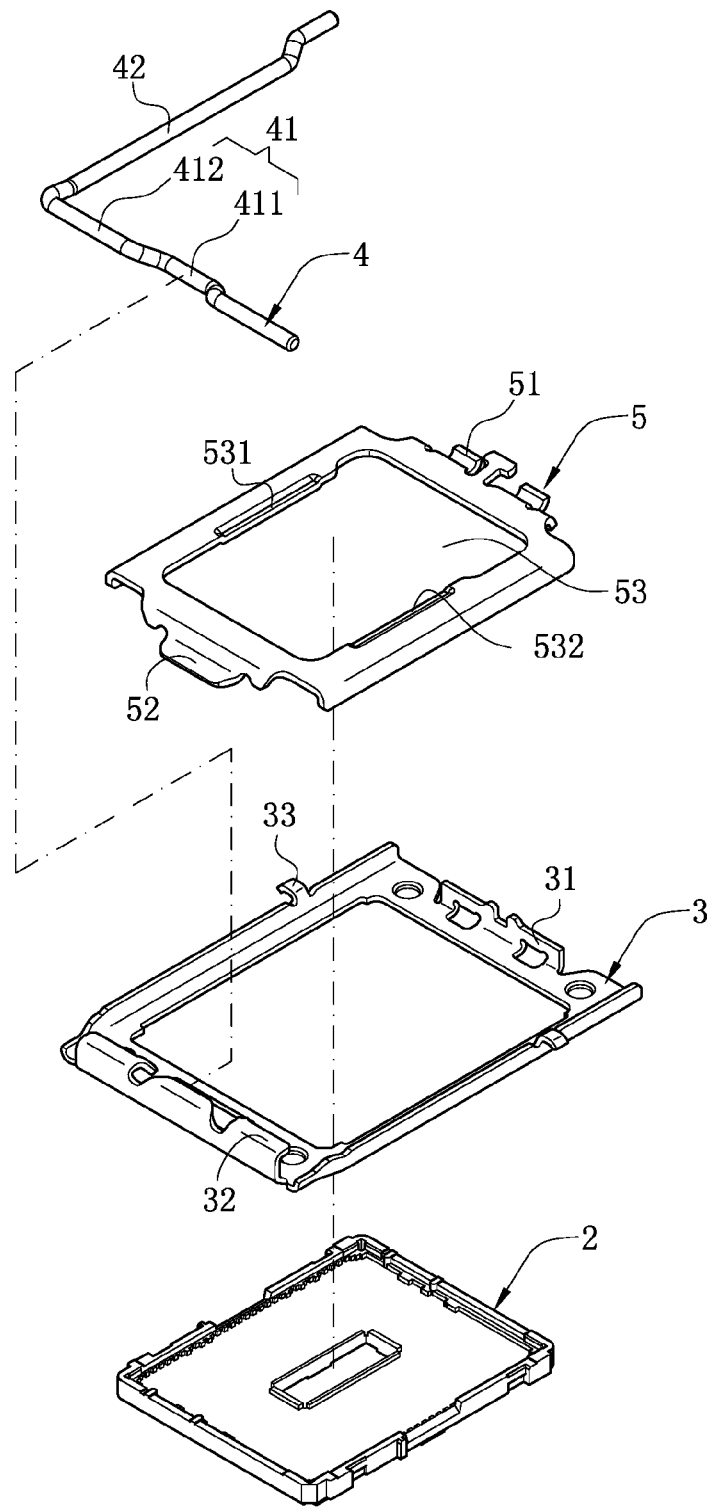
FIG. 3 is an exploded view of an electrical connector according to one embodiment of the present invention.
Figure 5:
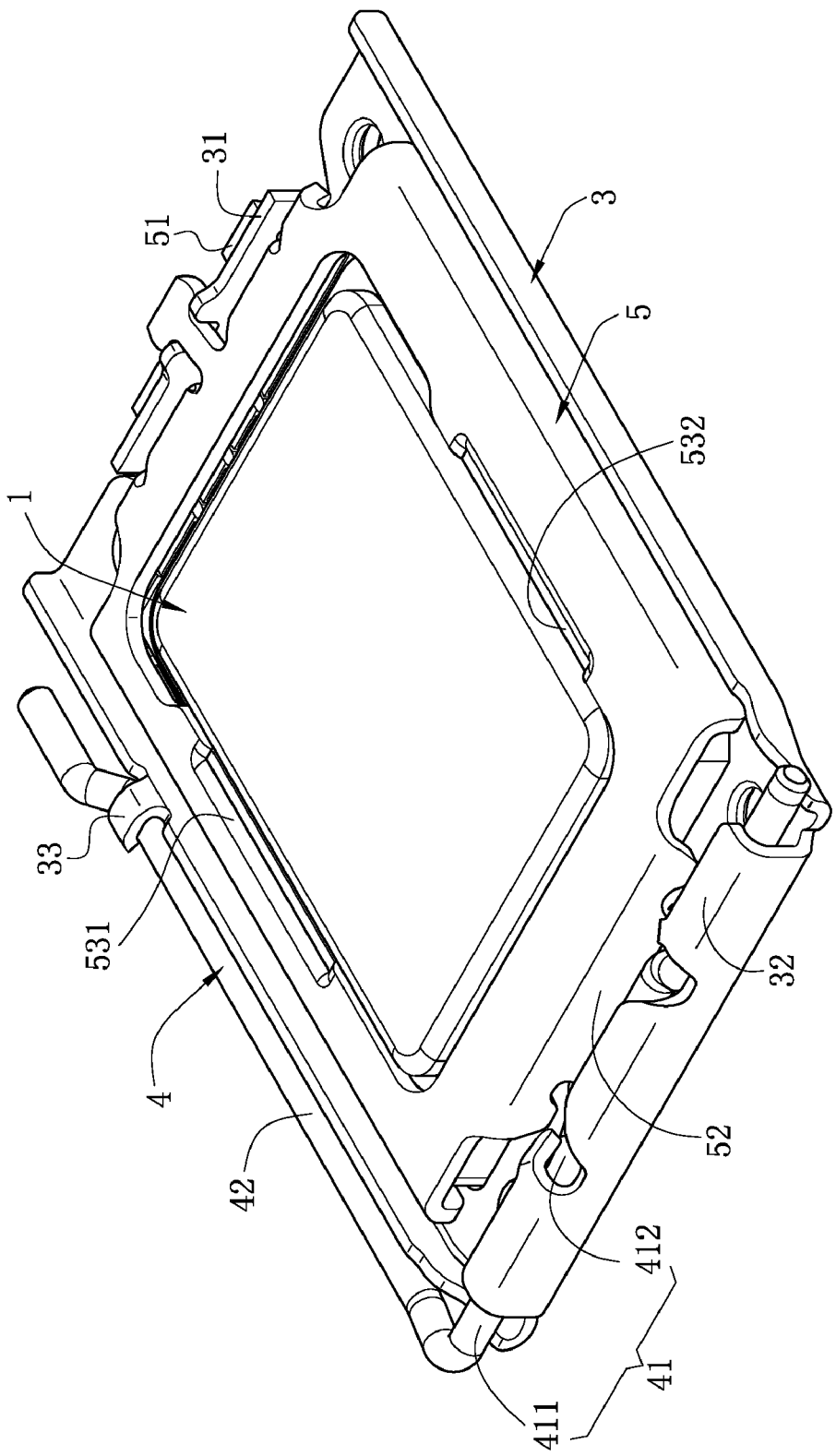
FIG. 5 is a three-dimensional view of an electrical connector and a chip module after assembly according to one embodiment of the present invention.

Referring to FIGS. 3 and 5, an electrical connector according to one embodiment of the present invention is used for electrically connecting a chip module 1 to a circuit board (not shown), and includes an electrical connecting base 2, a fixing member 3, an operating member (which is a rocker 4 in this embodiment), and a press cover 5.

Figure 4:
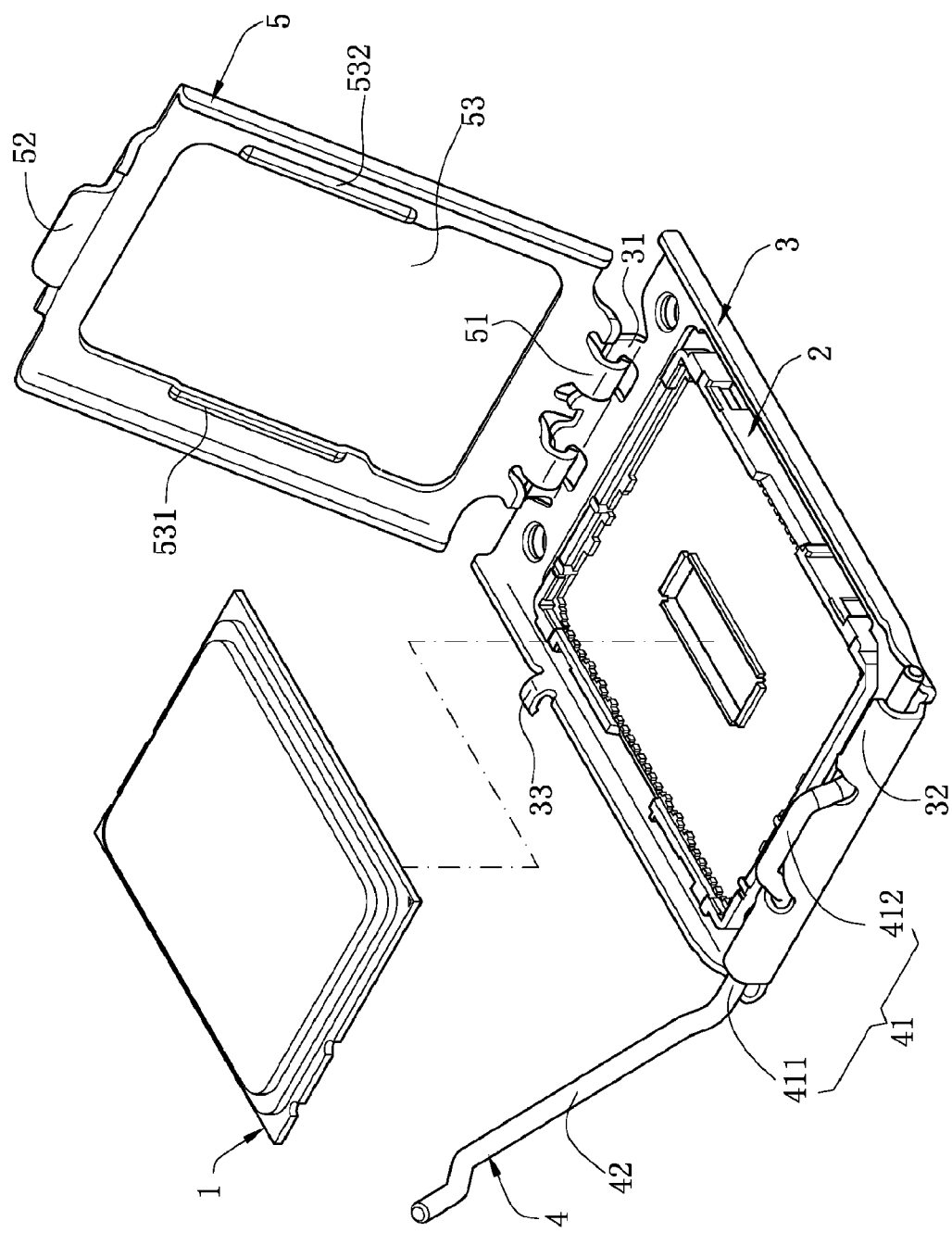
FIG. 4 is a three-dimensional view of an electrical connector and a chip module before assembly according to one embodiment of the present invention.

Referring to FIG. 4, the electrical connecting base 2 is used for bearing the chip module 1, and receives a plurality of conductive terminals (not shown). The conductive terminals (not shown) are electrically connected to the chip module 1 and the circuit board (not shown).

As shown in FIGS. 3 and 4, the fixing member 3 is a hollow frame structure disposed around the electrical connecting base 2. A first mounting portion 31 and a second mounting portion 32 are provided on two opposite sides of the fixing member 3, and a fastening portion 33 is provided on another side of the fixing member 3.

Referring to FIGS. 3-5, the rocker 4 is substantially L-shaped, and has a locking portion 41 and an operating portion 42 bent and extending from the locking portion 41. The locking portion 41 has two connecting portions 411 and a force applying portion 412 located between the two connecting portions 411. The two connecting portions 411 are pivotally connected to the second mounting portion 32 of the fixing member 3. The operating portion 42 is fastened to the fastening portion 33 of the fixing member 3 to fix the rocker 4.

Referring to FIGS. 3-6, the press cover 5 is a hollow frame structure covering on the electrical connecting base 2. A rear end of the press cover 5 is provided with a first fixing portion 51. The first fixing portion 51 is pivotally connected to the first mounting portion 31 so that the first fixing portion 51 is fixed to the fixing member 3. A front end of the press cover 5 is provided with a second fixing portion 52, which is adapted to be pressed by the force applying portion 412 of the rocker 4.

A center line L is defined on the press cover 5 along a front-to-rear direction, and the center line L passes through the second fixing portion 52.

As shown in FIGS. 3-6, a through hole 53 is formed in the center of the press cover 5 to partially receive the chip module 1. The press cover 5 is recessed downward from opposite left and right inner edges of the through hole 53 to respectively form a first pressing portion 531 and a second pressing portion 532 for pressing the chip module 1. The first pressing portion 531 and the second pressing portion 532 are respectively located on two sides of the center line L and are parallel to the center line L. A distance between the first pressing portion 531 and the center line L is equal to that between the second pressing portion 532 and the center line L.

Figure 6:
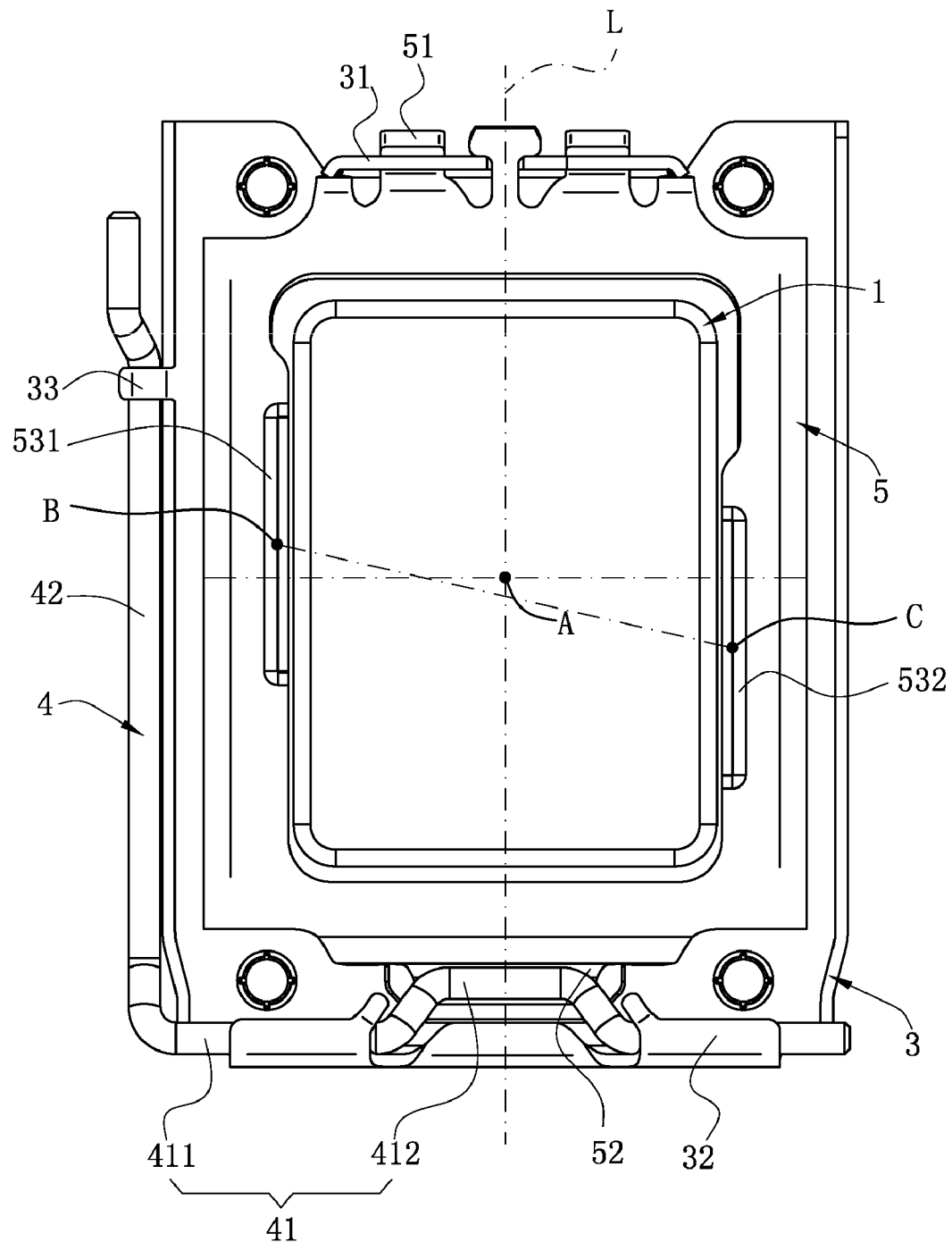
FIG. 6 is a top view of the structure shown in FIG. 5.

Referring to FIG. 6, the first pressing portion 531 is closer to the operating portion 42 than the second pressing portion 532 is, and the first pressing portion 531 and the second pressing portion 532 are staggered in the front-to-rear direction (that is, a line connecting the center B of the first pressing portion 531 and the center C of the second pressing portion 532 is not perpendicular to the center line L). In this embodiment, the center B of the first pressing portion 531 is located behind the center C of the second pressing portion 532 (that is, the second pressing portion 532 is closer to the second fixing portion 52 than the first pressing portion 531 is), and the center A of the chip module 1 is closer to the second fixing portion 52 than the center B of the first pressing portion 531 is (that is, the center A of the chip module 1 is located in front of the center B of the first pressing portion 531).

During assembly, referring to FIG. 3, first, the electrical connecting base 2 is soldered to the circuit board (not shown). Next, the connecting portion 411 of the rocker 4 is pivotally connected to the second mounting portion 32, and the first fixing portion 51 of the press cover 5 is pivotally connected to the first mounting portion 31. Then, the fixing member 3 is disposed around the electrical connecting base 2, and the fixing member 3 is fixed to the circuit board (not shown) by using fasteners (such as screws).

Referring to FIGS. 4 and 5, when it is intended to assemble the chip module 1 to the electrical connector, first, the chip module 1 is mounted on the electrical connecting base 2. Next, the press cover 5 is rotated downward so that the press cover 5 is covering on the electrical connecting base 1. Then, the operating portion 42 of the rocker 4 is rotated downward to operate the locking portion 41 so that the force applying portion 412 presses the second fixing portion 52, and the operating portion 42 is fastened to the fastening portion 33 of the fixing member 3, thereby fixing the rocker 4. Thus, the press cover 5 is also fixed. In this way, the first pressing portion 531 and the second pressing portion 532 press the chip module 1 downward, so that the chip module 1 closely contacts the conductive terminals in the electrical connecting base 1.

In the electrical connector of the present invention, since the second pressing portion 532 is closer to the second fixing portion 52 than the first pressing portion 531 is, the difference between the forces received by the first pressing portion 531 and the second pressing portion 532 caused by that the first pressing portion 531 is close to the operating portion 42 and the second pressing portion 532 is far away from the operating portion 42 is eliminated, so that a force balance is achieved when the chip module 1 is pressed by the first pressing portion 531 and the second pressing portion 532, thereby ensuring a stable electrical connection between the chip module 1 and the electrical connector.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, for electrically connecting a chip module, comprising:
   an electrical connecting base, for bearing the chip module;
   a press cover, covering on the electrical connecting base, and having a first fixing portion correspondingly fixed to a fixing member, and a second fixing portion opposite to the first fixing portion, wherein a center line of the press cover passes through the second fixing portion, the press cover is provided with a first pressing portion and a second pressing portion for pressing the chip module, the first pressing portion and the second pressing portion are respectively located on two sides of the center line, and the second pressing portion is closer to the second fixing portion than the first pressing portion is; and
   an operating member, having a locking portion for pressing the second fixing portion, and an operating portion extending from the locking portion, wherein the first pressing portion is closer to the operating portion than the second pressing portion is.

2. The electrical connector according to claim 1, wherein the first pressing portion and the second pressing portion are parallel to the center line, and a distance between the first pressing portion and the center line is equal to that between the second pressing portion and the center line.

3. The electrical connector according to claim 1, wherein a through hole is formed on an upper surface of the press cover to partially receive the chip module, and the first pressing portion and the second pressing portion are respectively provided on two opposite inner edges of the through hole.

4. The electrical connector according to claim 1, wherein the center of the chip module is closer to the second fixing portion than the center of the first pressing portion is.

5. The electrical connector according to claim 1, wherein the fixing member is disposed around the electrical connecting base, and the first fixing portion is pivotally connected to the fixing member.

6. The electrical connector according to claim 5, wherein the locking portion is pivotally connected to the fixing member, and the operating portion is fastened to the fixing member to fix the operating member.

7. An electrical connector, for electrically connecting a chip module, comprising:
   an electrical connecting base, for bearing the chip module; and
   a press cover, located above the electrical connecting base, and having a front end and a rear end opposite to the front end, wherein a center line is defined on the press cover along a front-to-rear direction, the press cover is provided with a first pressing portion and a second pressing portion which are respectively located on two sides of the center line, and when the chip module is assembled to the electrical connecting base and the front end and the rear end are fixed, the first pressing portion and the second pressing portion press the chip module downward, and the first pressing portion and the second pressing portion are staggered in the front-to-rear direction, so as to achieve a force balance on the chip module.

8. The electrical connector according to claim 7, wherein the first pressing portion and the second pressing portion are parallel to the center line, and a distance between the first pressing portion and the center line is equal to that between the second pressing portion and the center line.

9. The electrical connector according to claim 7, further comprising a rocker, wherein the rocker has a locking portion and an operating portion extending from the locking portion, and the locking portion is operated by the operating portion to press the front end.

10. The electrical connector according to claim 9, wherein the first pressing portion is closer to the operating portion than the second pressing portion is, and the center of the first pressing portion is located behind the center of the second pressing portion.

11. The electrical connector according to claim 9, further comprising a fixing member disposed around the electrical connecting base, wherein the rear end is pivotally connected to the fixing member.

12. The electrical connector according to claim 11, wherein the locking portion is pivotally connected to the fixing member, and the operating portion is fastened to the fixing member to fix the operating member.

\* \* \* \* \*